United States Patent [19]
Keeth et al.

[11] Patent Number: 5,999,033
[45] Date of Patent: *Dec. 7, 1999

[54] LOW-TO-HIGH VOLTAGE CMOS DRIVER CIRCUIT FOR DRIVING CAPACITIVE LOADS

[75] Inventors: Brent Keeth; William K. Waller, both of Boise, Id.

[73] Assignee: Micron Technology, Inc., Boise, Id.

[*] Notice: This patent is subject to a terminal disclaimer.

[21] Appl. No.: 09/231,853

[22] Filed: Jan. 14, 1999

Related U.S. Application Data

[63] Continuation of application No. 08/861,212, May 21, 1997, Pat. No. 5,883,538, which is a continuation of application No. 08/749,899, Nov. 13, 1996, Pat. No. 5,670,905, which is a continuation of application No. 08/603,499, Feb. 20, 1996, abandoned, which is a continuation of application No. 08/277,917, Jul. 20, 1994, abandoned.

[51] Int. Cl.[6] .................................................. H03L 5/00
[52] U.S. Cl. ........................ 327/333; 327/112; 326/81
[58] Field of Search .................................. 327/108, 111, 327/112, 379, 333; 326/63, 80, 81

[56] References Cited

U.S. PATENT DOCUMENTS

| | | | |
|---|---|---|---|
| 4,471,242 | 9/1984 | Noufer et al. | 307/475 |
| 4,695,744 | 9/1987 | Giordano | 307/279 |
| 4,713,600 | 12/1987 | Tsugaru et al. | 327/332 |
| 4,868,415 | 9/1989 | Dunn | 307/264 |
| 5,126,588 | 6/1992 | Reichmeyer et al. | 307/270 |
| 5,136,190 | 8/1992 | Chern et al. | 307/475 |
| 5,153,451 | 10/1992 | Yamamura et al. | 307/279 |
| 5,191,233 | 3/1993 | Nakano | 307/264 |
| 5,198,747 | 3/1993 | Haight | 323/303 |
| 5,204,562 | 4/1993 | Pace | 307/571 |
| 5,214,317 | 5/1993 | Nguyea | 327/208 |
| 5,321,324 | 6/1994 | Hardee et al. | 307/475 |
| 5,341,338 | 8/1994 | Hashiguchi et al. | 365/206 |
| 5,343,083 | 8/1994 | Fuse | 327/333 |
| 5,343,094 | 8/1994 | Nguyen | 307/475 |
| 5,345,121 | 9/1994 | Itoh | 327/208 |
| 5,355,032 | 10/1994 | Rogers et al. | 307/475 |
| 5,369,315 | 11/1994 | Tran | 316/82 |
| 5,399,915 | 3/1995 | Yahata | 327/333 |
| 5,455,528 | 10/1995 | Partovi et al. | 327/208 |
| 5,465,069 | 11/1995 | Boiron et al. | 327/333 |
| 5,559,996 | 9/1996 | Fujioka | 395/500 |

FOREIGN PATENT DOCUMENTS

| | | | |
|---|---|---|---|
| 0 633 644 A1 | 6/1994 | European Pat. Off. | H03K 19/00 |
| 1085416 | 3/1989 | Japan | 327/333 |
| 1152817 | 6/1989 | Japan | 327/333 |
| 4-91427 | 8/1989 | Japan . | |
| 1273417 | 11/1989 | Japan | 327/333 |
| 1-202917 | 8/1992 | Japan . | |
| WO 93/23926 | 11/1993 | WIPO | H03K 17/687 |
| WO 95/07575 | 3/1995 | WIPO | H03K 19/0185 |

*Primary Examiner*—Terry D. Cunningham
*Assistant Examiner*—Eunja Adolphe
*Attorney, Agent, or Firm*—Wells, St. John, Roberts, Gregory & Matkins, P.S.

[57] ABSTRACT

A high speed, low-to-high voltage CMOS driver circuit has a CMOS output stage, an intermediate voltage translation stage, and an input stage. The input and intermediate stages are designed to generate mutually exclusive control signals which activate the PMOS and NMOS transistors of the output stage. The control signals operably turn "off" the active transistor before turning "on" the inactive transistor. Independent control signals substantially reduce or eliminate crossing current in the output stage to thereby reduce energy power waste.

18 Claims, 7 Drawing Sheets

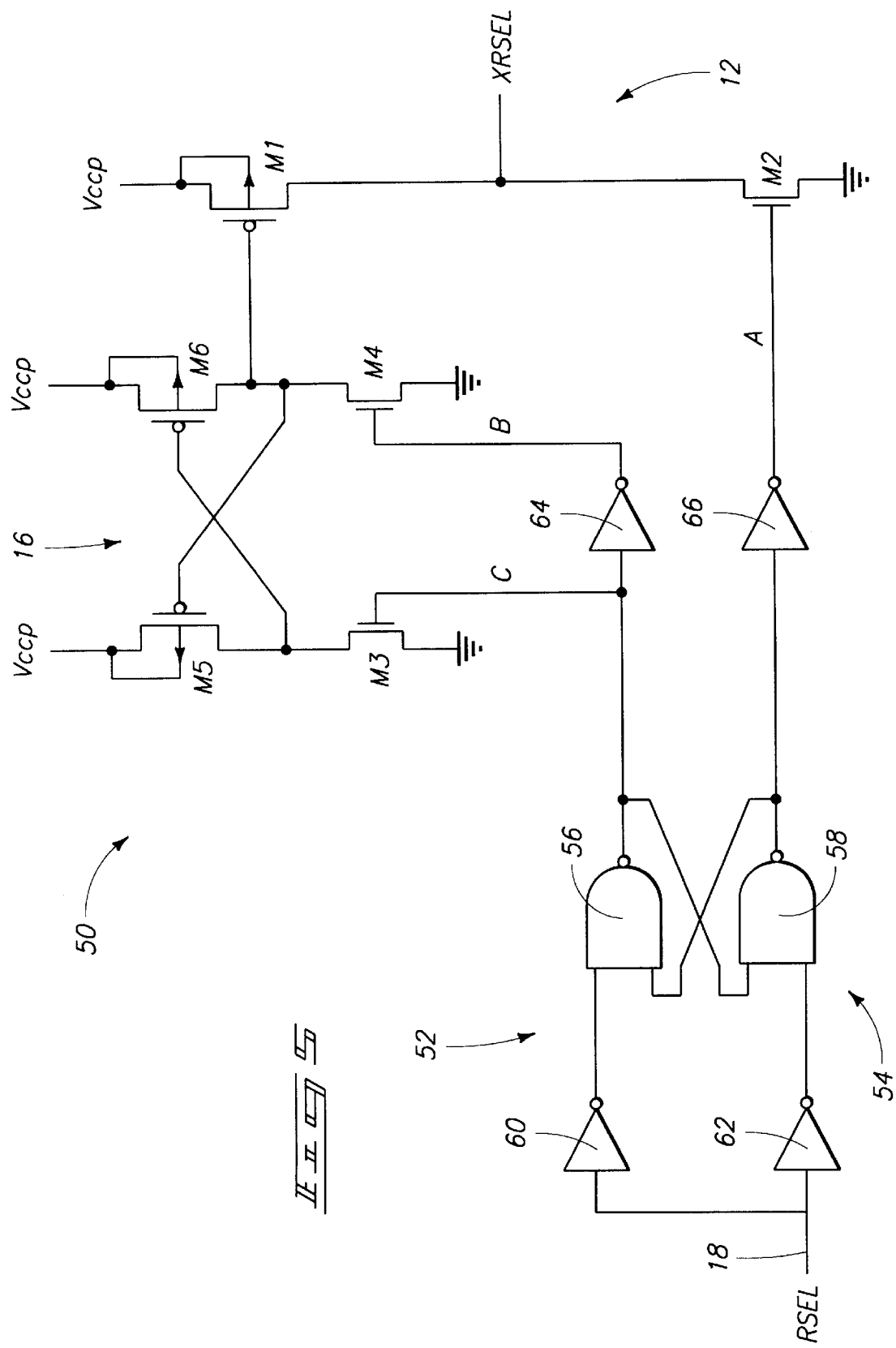

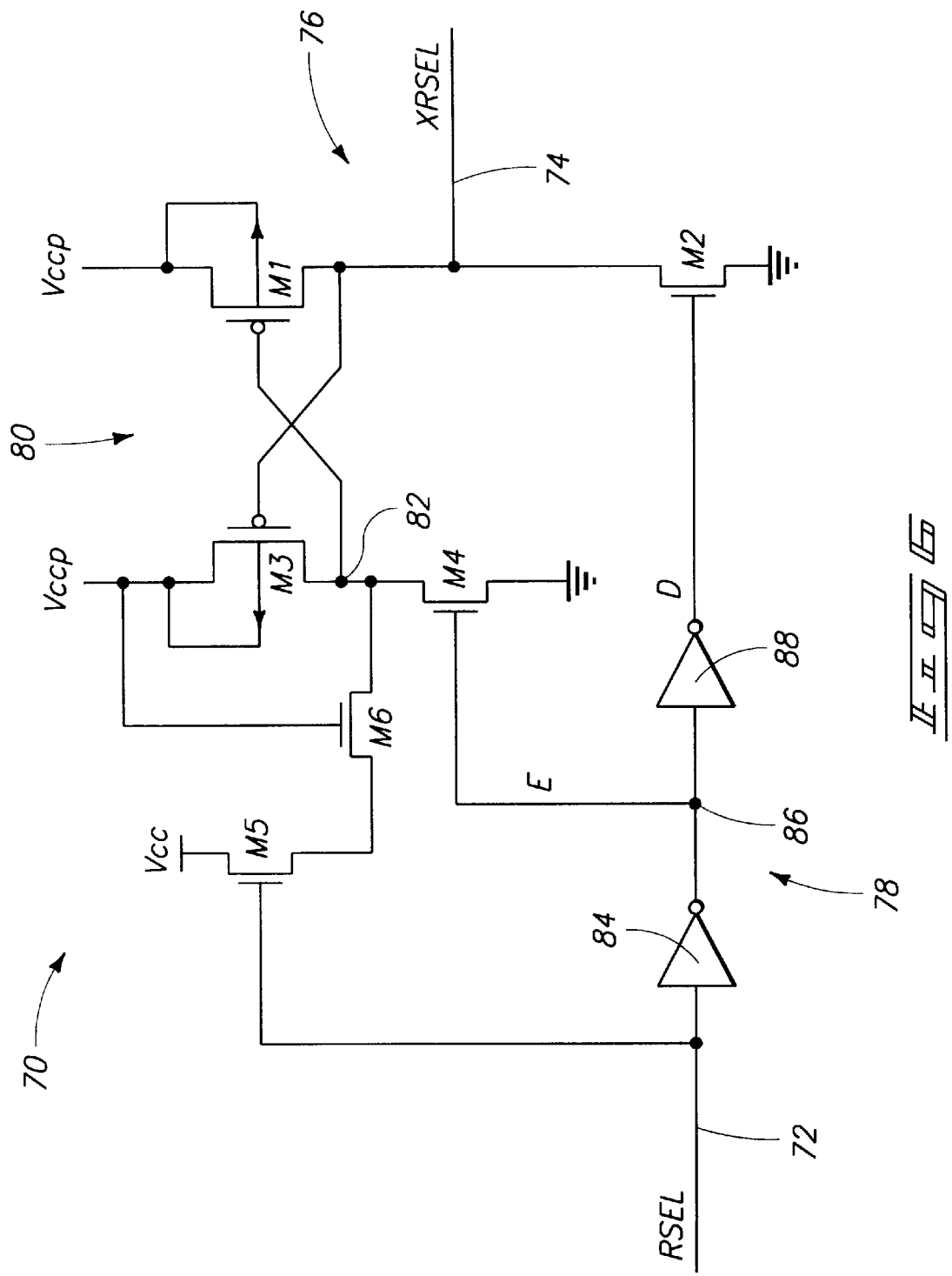

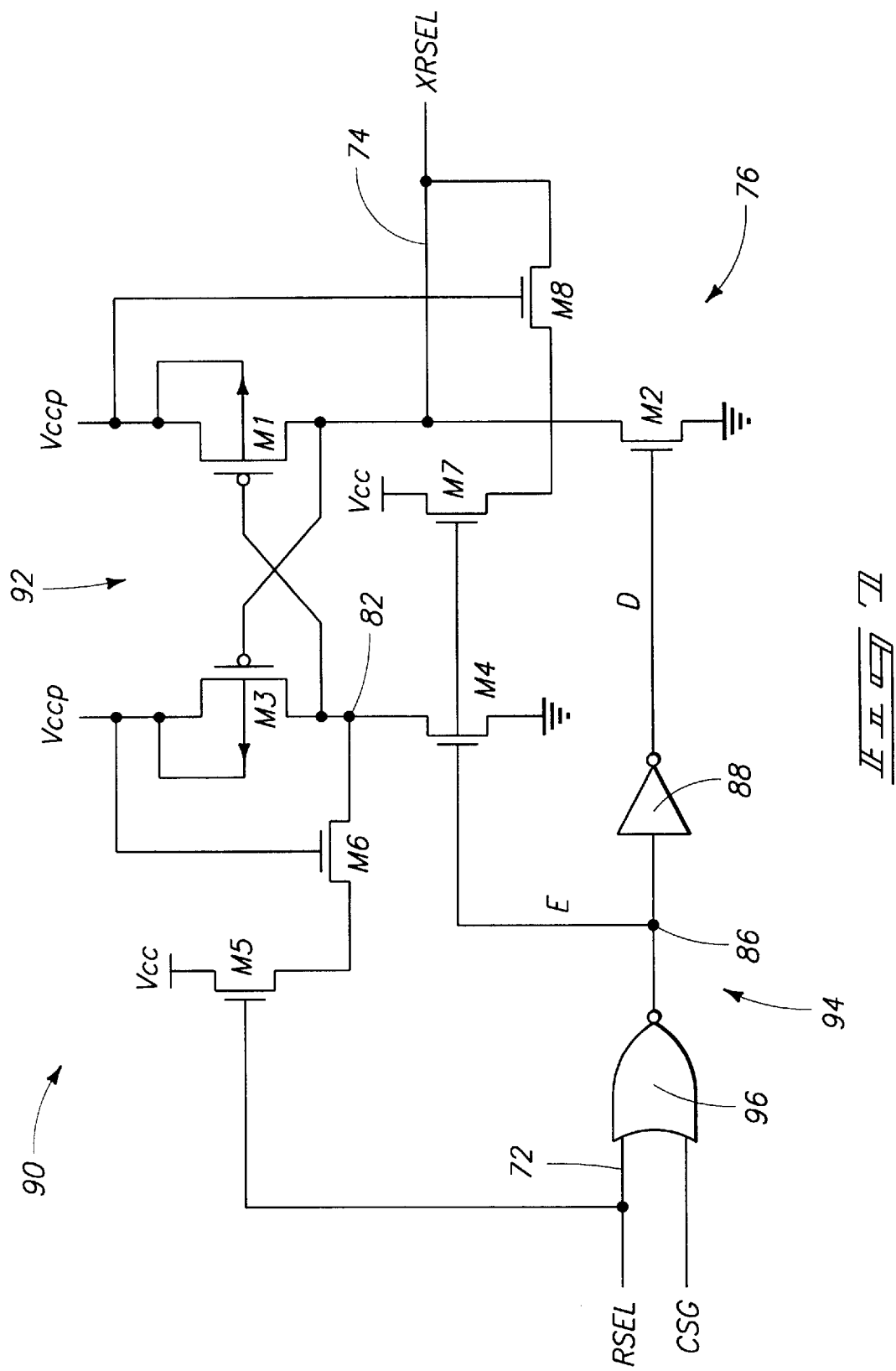

5,999,033

LOW-TO-HIGH VOLTAGE CMOS DRIVER CIRCUIT FOR DRIVING CAPACITIVE LOADS

CROSS REFERENCE TO RELATED APPLICATION

This is a continuation of U.S. patent application Ser. No. 08/861,212, filed May 21, 1997, now U.S. Pat. No. 5,883,538, and titled "Low-To-High Voltage CMOS Driver for Driving Capacitive Loads", which in turn is a continuation of U.S. patent application Ser. No. 08/749,899, filed Nov. 13, 1996, now U.S. Pat. No. 5,670,905, which in turn is a File Wrapper Continuation of U.S. patent application Ser. No. 08/603,499, filed Feb. 20, 1996, now abandoned, which in turn is a continuation application of Ser. No. 08/277,917, filed Jul. 20, 1994, now abandoned.

TECHNICAL FIELD

This invention relates to high speed, low-to-high voltage CMOS driver circuits for driving capacity loads.

BACKGROUND OF THE INVENTION

Semiconductor integrated circuits employ output driver circuits to drive capacitive loads. One example use of an output driver circuit is to drive row select lines in a semiconductor memory array.

Conventional output driver circuits utilize complementary metal-on-semiconductor (CMOS) technology. A conventional CMOS output circuit includes a p-channel MOS (PMOS) transistor coupled between voltage and an output node, and an n-channel MOS (NMOS) transistor coupled between the output node and ground. The CMOS design enables the PMOS transistor to be "on" while the NMOS transistor is "off", and vice versa, in response to a single input signal. When the PMOS transistor is "on" and the NMOS transistor is "off", the CMOS driver circuit outputs a voltage. Conversely, when the PMOS transistor is "off" and the NMOS transistor is "on", the output of the CMOS driver circuit is grounded.

One drawback inherent in the design of conventional CMOS output driver circuits is that during the rail-to-rail voltage swing at the input, there exists a period of time when both the PMOS and NMOS transistors are "on". This dual activation condition causes a phenomenon known as "crossing current" which wastes power.

This invention provides a high speed, low-to-high voltage CMOS driver circuit which eliminates or substantially reduces crossing current in an effort to conserve power.

BRIEF DESCRIPTION OF THE DRAWINGS

Preferred embodiments of the invention are described below with reference to the following accompanying drawings.

FIG. 5 is a schematic of a low-to-high voltage CMOS driver circuit according to second embodiment of this invention.

FIG. 6 is a schematic of a low-to-high voltage CMOS driver circuit according to a third embodiment of this invention.

FIG. 7 is a schematic of a low-to-high voltage CMOS driver circuit according a fourth embodiment of this invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts". U.S. Constitution, Article 1, Section 8.

This invention concerns a high speed CMOS device for driving a capacitive load. The CMOS device includes a CMOS output stage having an NMOS transistor and a PMOS transistor coupled between a first voltage level, such as ground, and a second voltage level, such as Vccp. The CMOS output stage provides an output signal that swings between the first and second voltage levels depending upon whether the NMOS and PMOS transistors are "on" or "off".

The CMOS device further includes an output stage control means for receiving an input signal indicative of a desired output signal. The output stage control means generates first and second independent control signals which are used to selectively activate the transistors in the CMOS output stage. That is, the first independent control signal is coupled to turn "on" and "off" the NMOS transistor, and the second independent control signal is coupled to turn "on" and "off" the PMOS transistor. The output stage control means turns "off" the presently activated transistor before turning "on" the presently inactive transistor. In this manner, the output stage control means independently activates the NMOS and PMOS transistors in a time-staggered manner to minimize crossing current in the CMOS output stage. This in turn saves power which would otherwise be lost due to crossing current.

Figure 1:
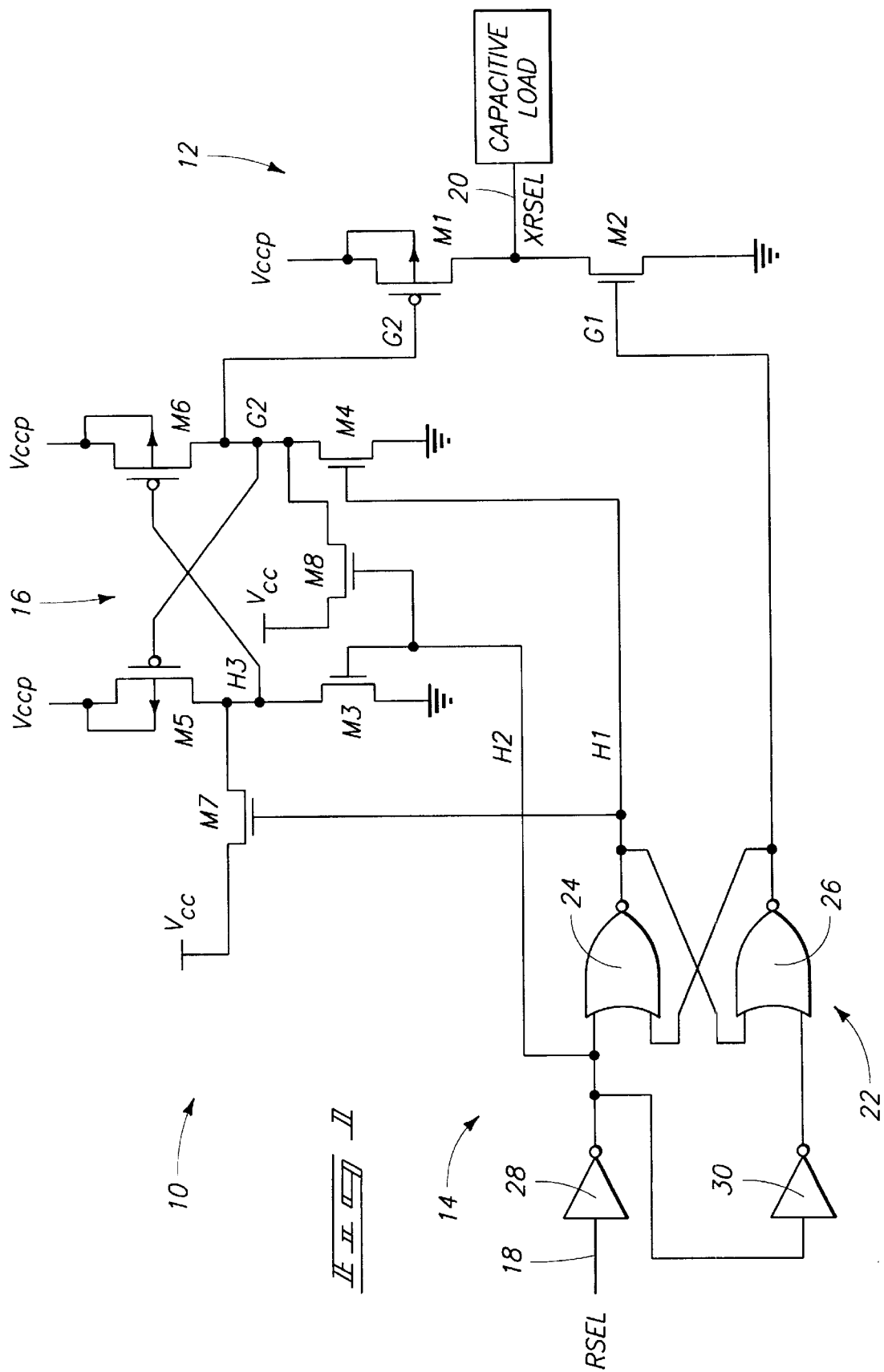
FIG. 1 is a schematic of a low-to-high CMOS driver circuit according to a first preferred embodiment of this invention. The CMOS driver circuit comprises a CMOS output stage, an input stage, and an intermediate stage translation stage.

FIG. 1 shows a high speed, low-to-high voltage CMOS driver circuit 10 according to a most preferred embodiment of this invention. CMOS driver circuit 10 is designed to drive a capacitive load. One example capacitive load is a global row select line in a semiconductor memory array. CMOS driver circuit 10 translates a low voltage input signal RSEL which swings between Vcc (e.g., 2.5 volts) and ground to a high voltage output signal XRSEL that swings between Vccp (e.g., 4.0 volts) and ground. The notation "RSEL" denotes "row select" in keeping with the example of driving a global row select line in a semiconductor memory device. The notation "XRESL" denotes a voltage translated version of the RSEL signal. The notation "Vccp" is customary to denote a higher voltage or pumped-up level above Vcc.

CMOS driver circuit 10 includes a CMOS output stage 12, an input stage 14, and a low crossing current intermediate voltage translation stage 16 coupled between the input and output stages. CMOS driver circuit 10 also has a driver input 18 which receives the low voltage input signal RSEL and a driver output 20 which outputs the high voltage output signal XRSEL.

CMOS output stage 12 has a first NMOS transistor M2 which has a source-to-drain path coupled between driver output 20 and a first voltage level or ground. CMOS output stage 12 also has a first PMOS transistor M1 which has a source-to-drain path coupled between a second voltage level, or Vccp, and driver output 20. The two transistors in the CMOS output stage 12 are controlled by two independent control signals G1 and G2. When the PMOS transistor M1 is "on" and the NMOS transistor M2 is "off", the output signal on driver output 20 is at Vccp. Conversely, when the PMOS transistor M1 is "off" and the NMOS transistor M2 is "on", the output signal XRSEL at driver output 20 is at ground. In this manner, the output signal XRSEL swings between Vccp and ground.

Input stage 14 is coupled to driver input 18 and receives input signal RSEL which swings between ground and a third voltage level, or Vcc. Input stage 14 generates at least two, and preferably three, independent control signals based upon input signal RSEL. In the FIG. 1 embodiment, input stage 14 generates a first control signal G1, a second control signal H1, and a third control signal H2. The first control signal G1 is input directly to output stage 12 to control the gate, and thereby activate or deactivate, the NMOS transistor M2. The remaining two control signals H1 and H2 are input to intermediate voltage translation stage 16, as described below in more detail.

Input stage 14 includes a latch 22 which generates control signals G1 and H1. Latch 22 is preferably configured as a cross-coupled NOR gate latch having NOR gates 24 and 26. Input stage 14 also includes an inverter 28 to initially invert input signal RSEL and a second inverter 30 coupled between the first inverter and the input of NOR gate 26.

Intermediate voltage translation stage 16 is coupled between input stage 14 and output stage 12. The voltage translation stage receives two internal control signals H1 and H2 from the input stage, and uses these control signals to generate an independent, higher voltage activation control signal G2. This control signal G2 is utilized to control the PMOS transistor M1 of output stage 12. Due to the inherent delay time that it takes input signal RSEL to propagate through input stage 14 and intermediate voltage translation stage 16, the control signal G2 is time staggered from control signal G1. As a result, control signals G1 and G2 independently turn "on" and "off" the CMOS transistors of output stage 12. This independent control minimizes or eliminates crossing current in the CMOS output stage.

Intermediate voltage translation stage 16 includes a pair of cross-coupled PMOS transistors M5 and M6. A first PMOS transistor M5 has a source-to-drain path coupled between Vccp and a first node H3. The second PMOS transistor M6 has a source-to-drain path coupled between Vccp and an output node G2 which is coupled to the gate of PMOS transistor M1 in output stage 12. The gate of second PMOS transistor M6 is coupled to node H3 and the gate of first PMOS transistor M5 is coupled to output node G2 to form the cross-coupled PMOS transistor structure.

Intermediate voltage translation stage 16 also includes a first NMOS control transistor M3 which has a source-to-drain path coupled between node H3 and ground. The gate of control transistor M3 is coupled to receive the third internal control signal H2 from input stage 14. A second NMOS control transistor M4 has a source-to-drain path coupled between output node G2 and ground. The gate of this second control transistor M4 is coupled to receive the second internal control signal H1 from input stage 14.

Control transistors M3 and M4 control the pair of cross-coupled PMOS transistors M5 and M6 to alternately output at output node G2 an internal control signal that swings between Vccp and ground. Internal signals G2 and H2 selectively turn "on" and "off" control transistors M3 and M4 in an alternating, out-of-phase fashion. When control transistor M3 is "on" and control transistor M4 is "off", first node H3 is grounded, thereby turning "on" PMOS transistor M6. The Vccp voltage is thus placed at output node G2, keeping PMOS transistor M5 in an "off" state.

When control transistor M4 is "on" and control transistor M3 is "off", output node G2 is grounded and first PMOS transistor M5 is turned "on". Second PMOS transistor M6 is turned "off". Intermediate stage 16 outputs a ground level voltage at output node G2.

According to another aspect of this invention, intermediate voltage translation circuit 16 includes NMOS precharge transistors M7 and M8. A first NMOS precharge transistor M7 which has a gate coupled to the gate of second NMOS control transistor M4 and to input stage 14. Precharge transistor M7 is selectively activated by second internal control signal H1. Precharge transistor M7 has a source-to-drain path coupled between Vcc and first node H3. Similarly, a second NMOS precharge transistor M8 has a gate coupled to the gate of first NMOS control transistor M3 and to input stage 14. Precharge transistor M8 is selectively activated by third internal control signal H2. Precharge transistor M8 has a source-to-drain path coupled between Vcc and output node G2.

The precharge transistors M7 and M8 raise respective nodes H3 and G2 toward Vcc before the cross-coupled PMOS transistors M5 and M6 turn "on" to further increase the voltage levels at those nodes to Vccp. For example, when internal control signal H1 goes high to turn "on" control transistor M4, it simultaneously turns "on" precharge transistor M7. As a result, first node H3 begins to rise from ground towards Vcc. Within a minor time delay, PMOS transistor M5 is turned "on" to further raise the voltage level at first node H3 to Vccp. The precharge transistor M8 does essentially the same function for output node G2. These precharge transistors help minimize crossing current through intermediate voltage translation stage 16 during transition.

Precharge transistors M7 and M8 form one implementation of a precharge means for precharging the pair of cross-coupled transistors M5 and M6 to facilitate transition during toggle between the two output states. Other gate arrangements besides the single NMOS transistors shown can also be used to precharge the respective nodes. Example alternatives might include PMOS transistors, pass circuits having a combination PMOS and NMOS transistors, or other equivalent structures.

Figure 2:
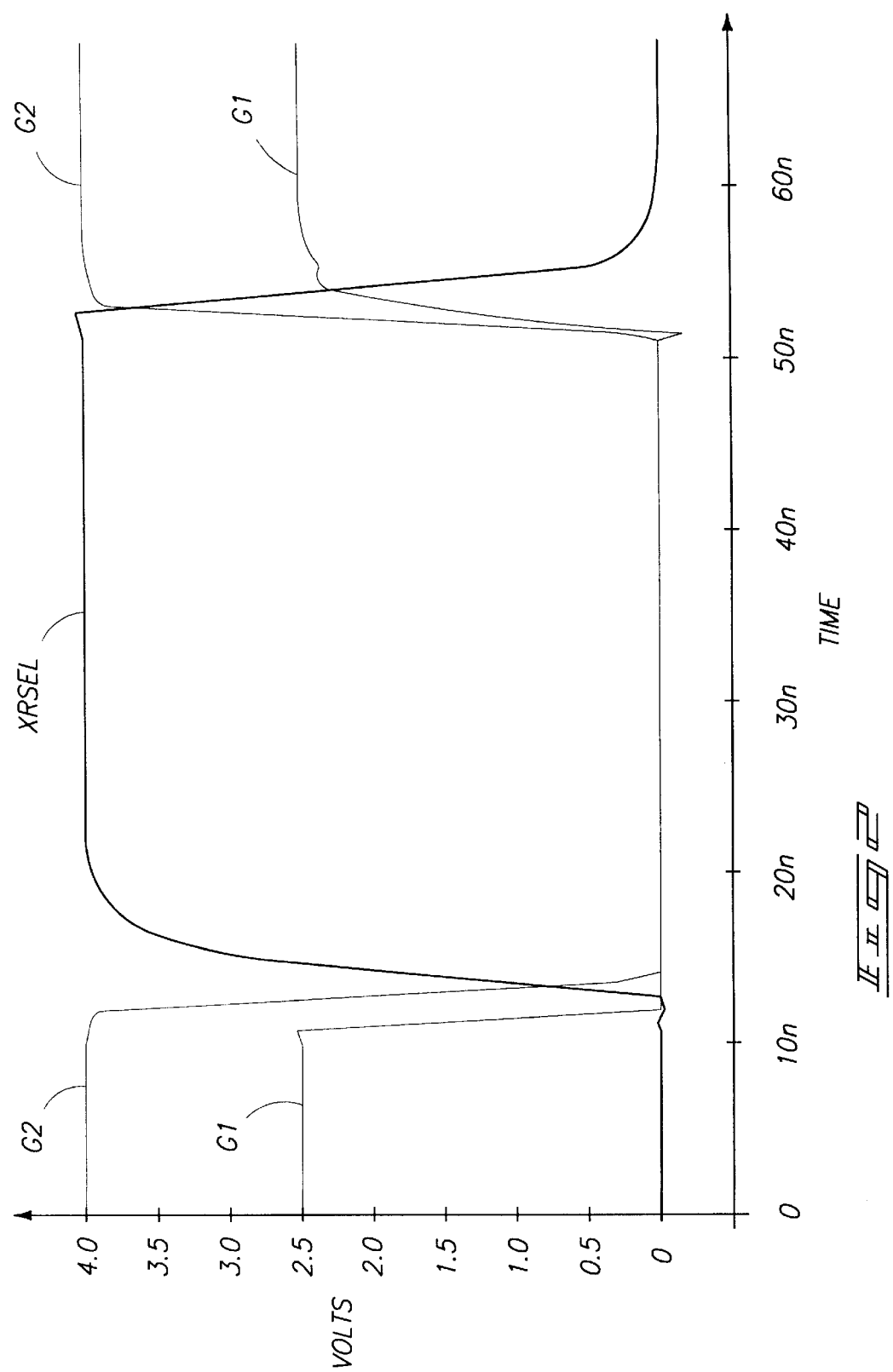
FIG. 2 is a timing diagram illustrating the signals input to, and output from, the CMOS output stage of the CMOS driver circuit of FIG. 1.

FIG. 2 illustrates a timing diagram of the independent control signals G1 and G2 used to activate respective transistors M2 and M1 in CMOS output stage 12. The timing diagram shows a first transition of output signal XRSEL from ground to Vccp (e.g., 4.0 volts) and a second transition from Vccp back to ground. During the first transition, independent control signal G1 goes low to first turn "off" NMOS transistor M2. Subsequently, the second independent control signal G2 goes low to turn "on" PMOS transistor M1. Due to the time-staggered nature of these two signals, output stage 12 experiences little or no crossing current during the transition. Accordingly, the operation conserves power by avoiding the crossing current.

During the second transition, second independent control signal G2 returns high to first turn "off" PMOS transistor M1. Subsequently, first independent control signal G1 returns high to thereby turn "on" NMOS transistor M2.

Again, the time-staggered nature of these two independent control signals prevents crossing current during the transition.

Figure 3:
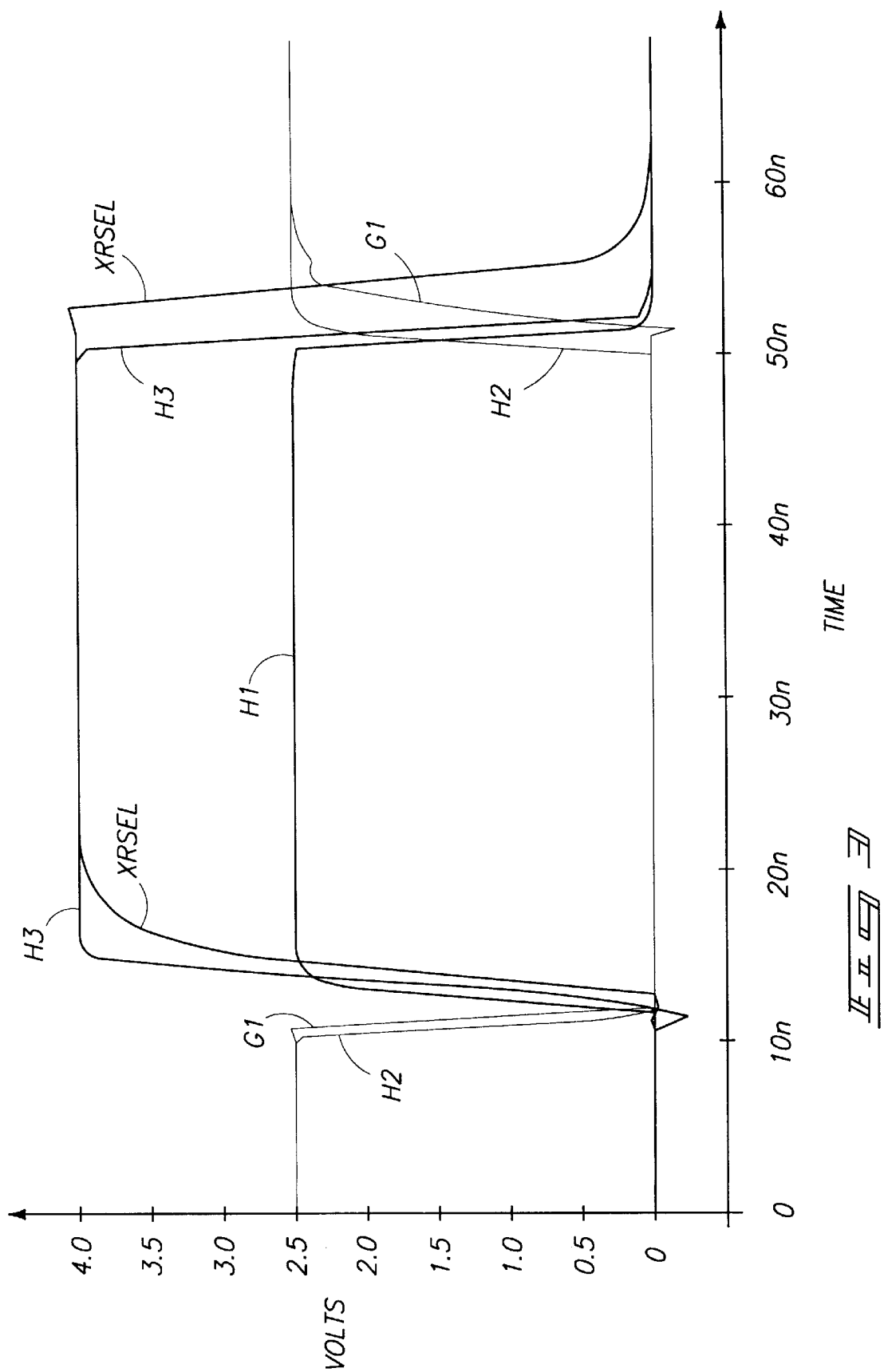
FIG. 3 is a timing diagram of signals generated by the input stage and used to control the intermediate voltage translation stage of the CMOS driver circuit of FIG. 1.

FIG. 3 illustrates the timing diagram of the internal control signals G1, H1, and H2. It is noted that independent control signal G1 follows internal control signal H2 with a slight lag caused by propagation delay through two semiconductor gates. Internal control signal H1 is inversely out-of-phase with control signals G1 and H2. With H1 and H2 out-of-phase, control transistors M3 and M4 are alternately "on" and "off". FIG. 3 also shows the voltage at first node H3 which swings from ground to Vccp (e.g., 4.0 volts).

Figure 4:
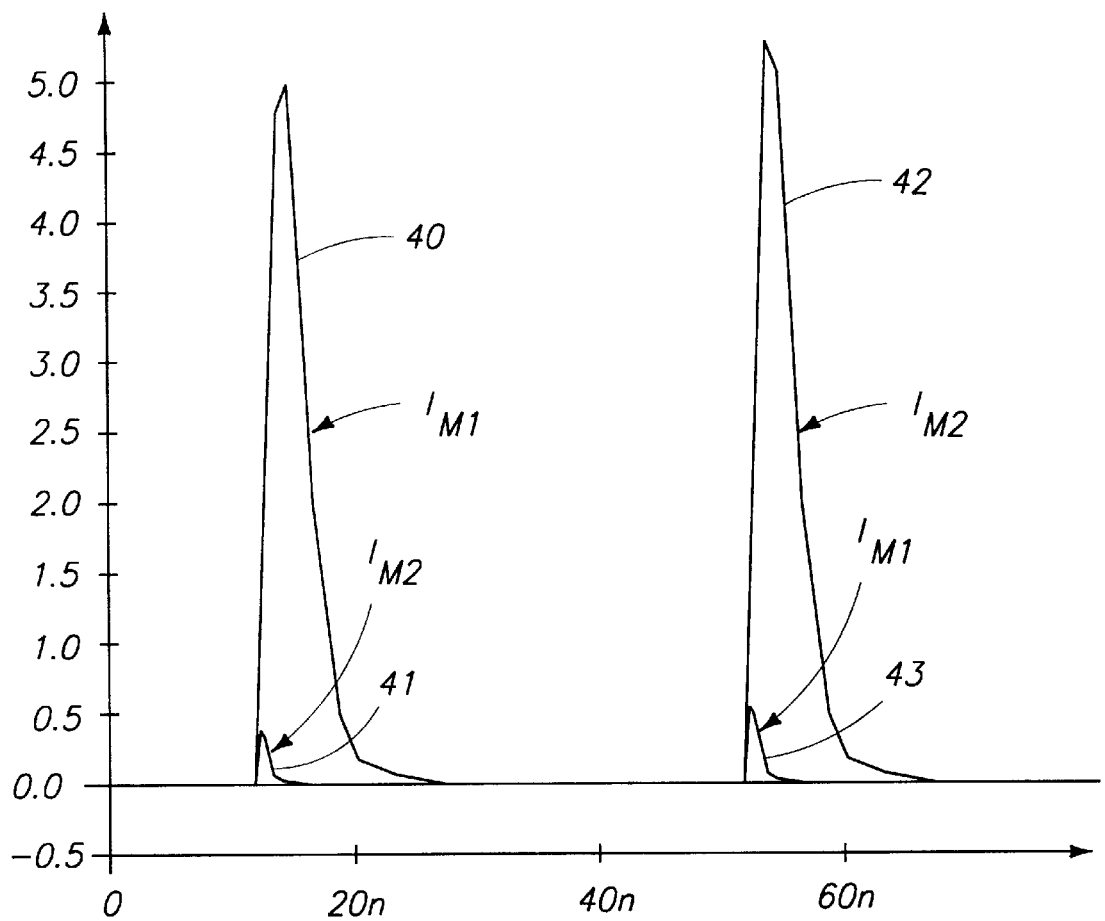
FIG. 4 illustrates current spikes generated during transition between low voltage output and high voltage output of the CMOS driver circuit in FIG. 1.

FIG. 4 shows the load current spikes measured at output stage 12 which occur during the transitions shown in FIGS. 2 and 3. These load current spikes represent the current flowing through either PMOS transistor M1 or NMOS transistor M2 into a capacitive load. If no crossing current existed, current spikes 41 and 43 would be eliminated. It is noted that the second current spike 42 has a slightly larger amplitude than the first current spike 40, indicating that the output stage did experience slightly higher crossing current on the high to low transition. However, the circuit design of this invention effectively minimizes such conditions.

It is further noted that the CMOS driver circuit 10 minimizes crossing current in the intermediate voltage translation stage 16. Accordingly, the circuit effectively eliminates or substantially reduces crossing current in both the output stage 12 and the intermediate stage 16.

FIG. 5 illustrates a low-to-high voltage CMOS driver circuit 50 according to a second embodiment of this invention. CMOS driver circuit 50 includes output stage 12, intermediate voltage translation stage 16, and an input stage 52. CMOS driver circuit 50 differs from CMOS driver circuit 10 of FIG. 1 in that input stage 52 includes a cross-coupled NAND gate latch 54 having a first NAND gate 56 and a second NAND gate 58. Input stage 52 further includes inverters 60 and 62 on the front end of NAND gate latch 54, and inverters 64 and 66 on the back end of the NAND gate latch. According to this construction, input stage 52 outputs three different control signals A, B, and C.

NAND gate latch 52 of driver circuit 50 in FIG. 5 substantially reduces crossing current in intermediate stage 16 and output stage 12, but not quite to the same extent as the NOR gate latch in driver circuit 10 of FIG. 1. Accordingly, the FIG. 5 embodiment is slightly less preferred than the embodiment of FIG. 1.

FIG. 6 illustrates a low-to-high voltage CMOS driver circuit 70 according to a third embodiment of this invention. The CMOS driver circuit 70 differs from the circuits of FIGS. 1 and 5 in that the intermediate and output stages are combined. That is, the same PMOS transistor M1 functions as an output transistor in the output stage as well as one of the cross-coupled transistors in the intermediate stage. Additionally, the NMOS transistor M2 has a dual function of an output transistor in the output stage and as a control transistor for the intermediate stage.

More specifically, CMOS driver circuit 70 includes a driver input 72, a driver output 74, an output stage 76, an input stage 78, and an intermediate voltage translation stage 80. A first PMOS transistor M1 has a source-to-drain path coupled between Vccp and driver output 74. The gate of PMOS transistor M1 defines a first node 82. A first NMOS transistor M2 has a source-to-drain path coupled between driver output 74 and ground. The gate of NMOS transistor M2 is coupled to input stage 78. A second PMOS transistor M3 has a source-to-drain path coupled between Vccp and first node 82. A second NMOS transistor M4 has a source-to-drain path coupled between first node 82 and ground.

PMOS transistor M1 and NMOS transistor M2 define output stage 76. Additionally, transistors M1–M4 define intermediate voltage translation stage 80. Accordingly, transistors M1 and M2 have dual roles in this circuit.

Input stage 78 generates two mutually exclusive signals D and E which are coupled to operate NMOS transistors M2 and M4. Input stage 78 comprises a first inverter 84 coupled between driver input 72 and a second node 86, and a second inverter 88 coupled between second node 86 and the gate of NMOS transistor M2. Second node 86 is tied to the gate of NMOS transistor M4.

In the FIG. 6 embodiment, intermediate voltage translation stage 80 also includes a third NMOS transistor M5 and a fourth NMOS transistor M6. Transistors M5 and M6 have source-to-drain paths coupled in series between Vcc and first node 82. The gate of third transistor M5 is coupled to driver input 72 and the gate of fourth transistor M6 is coupled to Vccp. Transistors M5 and M6 act to precharge node 82 in an effort to facilitate toggle transition of the cross-coupled PMOS transistors M1 and M3, in a manner similar to that described above with respect to FIG. 1.

FIG. 7 illustrates a low-to-high voltage CMOS driver circuit 90 according to a fourth embodiment of this invention. Driver circuit 90 is similar to circuit 70 of FIG. 6, but has a slightly different construction in the intermediate voltage translation stage 92 and the input stage 94. Only the differences in this circuit as compared to the circuit of FIG. 6 will be described in detail.

Intermediate voltage translation stage 92 includes a fifth NMOS transistor M7 and sixth NMOS transistor M8. Transistors M7 and M8 have source-to-drain paths coupled in series between Vcc and driver output 74. Fifth transistor M7 has a gate tied to the gate of transistor M4 and to node 86. The gate of sixth transistor M8 is coupled to Vccp. Transistors M7 and M8 function to precharge the cross-coupled PMOS transistors of intermediate voltage translation stage 92 by preliminarily bringing the voltage at the driver output node 74 to Vcc.

Input stage 94 has a NOR gate 96 coupled between driver input 72 and second node 86, and inverter 88. NOR gate 96 has a second input coupled to receive a second control signal CSG.

The high speed, low-to-high voltage CMOS driver circuits of this invention are advantageous over prior art output driver circuits in that the output stage is driven by independent control signals which turn "off" the activated transistor before turning "on" the inactive transistor. In this manner, crossing current within the output stage is minimized or eliminated. The circuit therefore conserves power by avoiding cross-current during signal swings.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method comprising:
   translating a low voltage to a high voltage by:
      providing a CMOS output stage having a PMOS transistor and an NMOS transistor coupled between first and second voltage levels;

receiving at an input stage an input signal that swings between the first voltage level and a third voltage level that is less than the second voltage level, the input stage including a latch, generating at the input stage at least first and second control signals based upon the input signal, the first control signal being used to activate one transistor of the CMOS output stage, the input stage further generating a third control signal;

receiving at an intermediate voltage translation stage the second control signal from the input stage and using the second control signal to generate an activation signal at the second voltage level, the activation signal activating the other transistor of the CMOS output stage at a different time than the input stage activates the one transistor of the CMOS output stage, the input stage, the output stage, and the intermediate voltage translation stage operating together to minimize crossing current in the CMOS output stage, the intermediate voltage translation stage including a pair of cross-coupled transistors which are operably controlled by the second and third control signals from the input stage; and coupling a capacitive load to the output of the CMOS output stage, and driving the capacitive load.

2. A method according to claim 1 and further comprising activating the NMOS transistor in the CMOS output stage using the input stage; and activating the PMOS transistor in the CMOS output stage with the intermediate voltage translation stage.

3. A method according to claim 1 wherein the latch of the input stage includes a cross-coupled NOR gate latch to generate the first and second control signals.

4. A method according to claim 1 wherein the latch of the input stage includes a cross-coupled NAND gate latch to generate the first and second control signals.

5. A method according to claim 1 wherein the latch of the input stage further comprises a pair of cross-coupled gates having respective inputs and outputs, and an inverter having an output connected to one of the inputs of the cross-coupled gates, and the method further comprising using the output of the inverter to generate the third control signal, and using one of the outputs of the cross-coupled gates to generate the second control signal.

6. A method of translating a low voltage to a high voltage, the method comprising:

coupling a PMOS transistor and an NMOS transistor between first and second voltage levels to define a CMOS output stage providing an output signal capable of swinging between the first and second voltage levels;

receiving at an input stage an input signal that swings between the first voltage level and a third voltage level that is less than the second voltage level, generating at the input stage, using a cross-coupled latch, first and second control signals based upon the input signal, using the first control signal to activate one transistor of the CMOS output stage, and generating at the input stage a third control signal; and receiving at an intermediate voltage translation stage the second control signal from the input stage and using the second control signal to generate an activation signal at the second voltage level, the activation signal activating the other transistor of the CMOS output stage at a different time than the input stage activates the one transistor of the CMOS output stage, the input stage, the output stage, and the intermediate stage operating together to minimize crossing current in the CMOS output stage, precharging in the intermediate voltage translation stage a pair of cross-coupled transistors having inversely related output states to facilitate transition during toggle between the output states, and toggling the cross-coupled transistors using first and second control transistors operably respectively controlled by the third and second control signals from the input stage.

7. A method according to claim 6 wherein the intermediate voltage translation stage activates the PMOS transistor in the CMOS output stage.

8. A method of translating a low voltage input signal that swings between Vcc and ground to a high voltage output signal that swings between Vccp and ground, where Vccp>Vcc; the method comprising:

receiving the low voltage input signal at a driver input;

coupling a source-to-drain path of a PMOS transistor between Vccp and a driver output which outputs the high voltage signal, and coupling a source-to-drain path of an NMOS transistor between the driver output and ground, the NMOS transistor and PMOS transistor defining an output stage;

generating at an input stage three different signals and outputting them over three outputs, the input stage including a latch, coupling the first output of the input stage to a gate of the NMOS transistor in the output stage; and coupling an intermediate voltage translation stage between the input and output stages, the intermediate voltage translation stage including:

a pair of first and second cross-coupled PMOS transistors, the first PMOS transistor having a gate and a source-to-drain path coupled between Vccp and a first node, the second PMOS transistor having a gate and a source-to-drain path coupled between Vccp and an output node, the gate of the second PMOS transistor being coupled to the first node and the gate of the first PMOS transistor being coupled to the output node to form the cross-coupled PMOS transistor structure, the output node being coupled to the gate of the PMOS transistor in the output stage;

a first NMOS control transistor having a gate coupled to the third output of the input stage and a source-to-drain path coupled between the first node and ground; and a second NMOS control transistor having a gate coupled to the second output of the input stage and a source-to-drain path coupled between the output node and ground;

the input stage, the output stage, and the intermediate stage operating together to minimize crossing current.

9. A method according to claim 8 wherein the latch of the input stage includes a cross-coupled NOR gate latch to generate the first and second control signals.

10. A method according to claim 8 wherein the latch of the input stage includes a cross-coupled NAND gate latch to generate the first and second control signals.

11. A method of translating a low voltage input signal that swings between a first voltage and a second voltage to a high voltage output signal that swings between a third voltage and the second voltage, where the third voltage is greater than the first voltage; the method comprising:

coupling a first electrode to the first voltage;

coupling a second electrode to the second voltage;

coupling a third electrode to the third voltage;

receiving at a driver input the low voltage input signal;

outputting at a driver output the high voltage output signal;

coupling a source-to-drain path of a PMOS transistor between the third electrode and the driver output, and coupling a source-to-drain path of an NMOS transistor between the driver output and the second electrode, the NMOS and PMOS transistors defining an output stage;

generating at an input stage three different signals and outputting them over three outputs, the input stage including a latch, coupling the first output of the input stage to a gate of the NMOS transistor in the output stage; and coupling an intermediate voltage translation stage between the input and output stages, the intermediate voltage translation stage including:
  a pair of first and second cross-coupled PMOS transistors, the first PMOS transistor having a gate and a source-to-drain path coupled between the third electrode and a first node, the second PMOS transistor having a gate and a source-to-drain path coupled between the third electrode and an output node, the gate of the second PMOS transistor being coupled to the first node and the gate of the first PMOS transistor being coupled to the output node to form the cross-coupled PMOS transistor structure, the output node being coupled to the gate of the PMOS transistor in the output stage;
  a first NMOS control transistor having a gate coupled to the third output of the input stage and a source-to-drain path coupled between the first node and the second electrode; and
  a second NMOS control transistor having a gate coupled to the second output of the input stage and a source-to-drain path coupled between the output node and the second electrode.

12. A low-to-high voltage CMOS driver circuit according to claim 11 wherein the latch of the input stage includes a cross-coupled NOR gate.

13. A low-to-high voltage CMOS driver circuit according to claim 11 wherein the latch of the input stage includes a cross-coupled NAND gate.

14. A low-to-high voltage CMOS driver circuit according to claim 11 wherein the intermediate voltage translation stage further comprises:
  a first NMOS precharge transistor having a gate coupled to the second NMOS control transistor and a source-to-drain path coupled between the first electrode and the first node; and
  a second NMOS precharge transistor having a gate coupled to the first NMOS control transistor and a source-to-drain path coupled between the first electrode and the output node.

15. A method of translating a low voltage input signal that swings between Vcc and ground to a high voltage output signal that swings between Vccp and ground, where Vccp>Vcc; the method comprising:
  receiving the low voltage input signal at a driver input;
  coupling a source-to-drain path of a PMOS transistor between Vccp and a driver output which outputs the high voltage signal, and coupling a source-to-drain path of an NMOS transistor between the driver output and ground, the NMOS transistor and PMOS transistor defining an output stage;
  generating at an input stage three different signals and outputting them over three outputs, coupling the first output of the input stage to a gate of the NMOS transistor in the output stage, the input stage including a latch; and
  coupling an intermediate voltage translation stage between the input and output stages, the intermediate voltage translation stage including:
    a pair of first and second cross-coupled PMOS transistors, the first PMOS transistor having a gate and a source-to-drain path coupled between Vccp and a first node, the second PMOS transistor having a gate and a source-to-drain path coupled between Vccp and an output node, the gate of the second PMOS transistor being coupled to the first node and the gate of the first PMOS transistor being coupled to the output node to form the cross-coupled PMOS transistor structure, the output node being coupled to the gate of the PMOS transistor in the output stage;
    a first NMOS control transistor having a gate coupled to the third output of the input stage and a source-to-drain path coupled between the first node and ground; and
    a second NMOS control transistor having a gate coupled to the second output of the input stage and a source-to-drain path coupled between the output node and ground.

16. A method according to claim 15 wherein the latch of the input stage includes a cross-coupled NOR gate latch to generate the first and second control signals.

17. A low-to-high voltage CMOS driver circuit according to claim 15 wherein the latch of the input stage includes a cross-coupled NAND gate latch to generate the first and second control signals.

18. A method comprising:
  translating a low voltage to a high voltage by:
    providing a CMOS output stage having a PMOS transistor and an NMOS transistor coupled between first and second voltage levels;
    receiving at an input stage an input signal that swings between the first voltage level and a third voltage level that is less than the second voltage level, the input stage including a latch, generating at the input stage at least first and second control signals based upon the input signal, the first control signal being used to activate one transistor of the CMOS output stage, the input stage further generating a third control signal; and
    receiving at an intermediate voltage translation stage the second control signal from the input stage and using the second control signal to generate an activation signal at the second voltage level, the activation signal activating the other transistor of the CMOS output stage at a different time than the input stage activates the one transistor of the CMOS output stage.

* * * * *

UNITED STATES PATENT AND TRADEMARK OFFICE
CERTIFICATE OF CORRECTION

PATENT NO : 5,999,033
DATED : December 7, 1999
INVENTOR(S) : Brent Keeth and William K. Waller It is certified that error appears in the above-identified patent and that said Letters Patent is hereby corrected as shown below:

Col. 1, line 60
  replace third instance of "stage"
  with --voltage--.

Col. 2, line 55
  replace "XRESL"
  with --XRSEL--.

Signed and Sealed this

Fifth Day of December, 2000

Attest:

Attesting Officer

Q. TODD DICKINSON
Director of Patents and Trademarks